(12) United States Patent
Takiar et al.

(10) Patent No.: US 8,022,417 B2
(45) Date of Patent: Sep. 20, 2011

(54) METHOD OF ASSEMBLING SEMICONDUCTOR DEVICES WITH LEDS

(75) Inventors: Hem Takiar, Fremont, CA (US); Suresh Upadhyayula, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/901,787

(22) Filed: Oct. 11, 2010

(65) Prior Publication Data

US 2011/0024897 A1     Feb. 3, 2011

Related U.S. Application Data

(62) Division of application No. 12/108,837, filed on Apr. 24, 2008, now Pat. No. 7,812,356, which is a division of application No. 11/129,637, filed on May 13, 2005, now Pat. No. 7,384,817.

(51) Int. Cl.
| | |
|---|---|
| H01L 27/15 | (2006.01) |
| H01L 29/161 | (2006.01) |
| H01L 31/12 | (2006.01) |
| H01L 31/153 | (2006.01) |
| H01L 33/00 | (2006.01) |

(52) U.S. Cl. ............... 257/84; 257/79; 257/81; 257/100
(58) Field of Classification Search ............ 257/79–100
See application file for complete search history.

(56) References Cited

U.S. PATENT DOCUMENTS

| | | | |
|---|---|---|---|
| 6,157,050 A | 12/2000 | Fukuoka | |
| 6,173,490 B1 | 1/2001 | Lee et al. | |
| 6,521,441 B1 | 2/2003 | Simpson et al. | |
| 2004/0090829 A1 | 5/2004 | Miura et al. | |
| 2004/0201080 A1 | 10/2004 | Basoor et al. | |
| 2004/0259291 A1 | 12/2004 | Takiar | |
| 2005/0014298 A1 | 1/2005 | Takiar | |
| 2006/0105484 A1 | 5/2006 | Basin et al. | |

FOREIGN PATENT DOCUMENTS

| | | |
|---|---|---|
| DE | 2909899 A1 | 11/2006 |
| EP | 0302617 A1 | 2/1989 |
| JP | 59009982 A | 1/1984 |
| JP | 60115293 A | 6/1985 |
| JP | 60256885 A | 12/1985 |

(Continued)

OTHER PUBLICATIONS

Chinese Office Actin dated Dec. 8, 2010 in Chinese Patent Application No. 200680016505.0.

(Continued)

*Primary Examiner* — Zandra Smith
*Assistant Examiner* — Telly D Green
(74) *Attorney, Agent, or Firm* — Vierra Magen Marcus & DeNiro LLP (57) ABSTRACT

Methods of forming integrated circuit packages having an LED molded into the package, and the integrated circuit package formed thereby. An integrated circuit including one or more semiconductor die, passive components and an LED may be assembled on a panel. The one or more semiconductor die, passive components and LED may all then be encapsulated in a molding compound, and the integrated circuits then singularized to form individual integrated circuit packages. The integrated circuits are cut from the panel so that a portion of the lens of the LED is severed during the singularization process, and an end of the lens remaining within the package lies flush with an edge of the package to emit light outside of the package.

8 Claims, 8 Drawing Sheets

FOREIGN PATENT DOCUMENTS

| | | |
|---|---|---|
| JP | 62009487 A | 1/1987 |
| JP | 04313269 A | 11/1992 |
| JP | 07030154 A | 1/1995 |
| TW | 560712 | 11/2003 |
| WO | 01/27885 A1 | 4/2001 |

OTHER PUBLICATIONS

International Search Report dated Sep. 28, 2006, International Patent Application no. PCT/US2006/018421.
English Translation of Abstract for JP59009982 published Jan. 19, 1984.
English Translation of Abstract for JP62009487 published Jan. 17, 1987.
English Translation of Abstract for JP07030154 published Jan. 31, 1995.
English Translation of Abstract for JP60256885 published Dec. 18, 1985.
English Translation of Abstract for JP04313269 published Nov. 5, 1992.
Korean Office Action dated Mar. 26, 2009 in Korean Patent Applicatiion No. 7026405/2007.
Chinese Office Action dated Apr. 3, 2009 in Chinese Patent Application No. 200680016505.0.
Office Action dated Apr. 26, 2010 in Korean Application No. 10-2010-7002239.
Taiwanese Office Action and Search Report dated May 28, 2008 in Taiwanese Patent Application No. 095116968.
Office Action dated Nov. 28, 2007 in U.S. Appl. No. 11/129,637.
Response to Office Action filed Dec. 18, 2007 in U.S. Appl. No. 11/129,637.
Notice of Allowance dated Jan. 30, 2008 in U.S. Appl. No. 11/129,637.
Office Action dated Feb. 12, 2010 in U.S. Appl. No. 12/108,837.
Response to Office Action filed Apr. 12, 2010 in U.S. Appl. No. 12/108,837.
Notice of Allowance dated Jun. 11, 2010 in U.S. Appl. No. 12/108,837.
Response to Chinese Office Action filed Mar. 21, 2011 in Chinese Patent Application No. 200680016505.0.

METHOD OF ASSEMBLING SEMICONDUCTOR DEVICES WITH LEDS

CLAIM OF PRIORITY

This application is a divisional of U.S. patent application Ser. No. 12/108,837 filed Apr. 24, 2008, entitled "Method of Assembling Semiconductor Devices With LEDS", which application is a divisional of U.S. patent application Ser. No. 11/129,637 filed May 13, 2005, entitled "Method of Assembling Semiconductor Devices With LEDS", which applications are incorporated herein by reference in their entirety.

BACKGROUND OF THE INVENTION

1. Field of the Invention

Embodiments of the present invention relate to methods of forming integrated circuit packages having an LED molded into the package, and the integrated circuit package formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a number of packaging configurations are known, flash memory storage cards may in general be fabricated as system-in-a-package (SiP) or multichip modules (MCM), where a plurality of dice are mounted on a substrate. The substrate may in general include a rigid base having a conductive layer etched on one or both sides. Electrical connections are formed between the dice and the conductive layer(s), and the conductive layer(s) provide an electric lead structure for integration of the dice into an electronic system. Once electrical connections between the dice and substrate are made, one or both sides of the assembly are then typically encased in a molding compound to provide a protective package.

In view of the small form factor requirements, as well as the fact that flash memory cards need to be removable and not permanently attached to a printed circuit board, such cards are often built of a land grid array (LGA) package. In an LGA package, the semiconductor die are electrically connected to exposed contact fingers formed on a lower surface of the package. External electrical connection with other electronic components on a host printed circuit board is accomplished by bringing the contact fingers into pressure contact with complementary electrical pads on the printed circuit board. LGA memory packages are ideal for flash memory cards in that they have a smaller profile and lower inductance than pin grid array (PGA) and ball grid array (BGA) packages.

Significant economies of scale are achieved by forming a plurality of integrated circuit (IC) packages at the same time on panels. In fabrication, the chips and other circuit components are mounted on the panel, which may be for example a substrate or leadframe, and molded in epoxy molding compound. Once fabricated, the IC packages are separated from the panel, and those which pass inspection may then be enclosed within an outer plastic lid to form a completed flash memory card.

After the molding process, it is known to physically and electrically attach a liquid crystal diode (LED) to a portion of the substrate outside of the molded package. In the finished flash memory, the LED may be illuminated by a controller within the IC package, for example to indicate when read/write operations are being performed on the flash memory. Conventionally, the LED is positioned outside of the molded package.

SUMMARY OF THE INVENTION

Embodiments of the present invention relate to methods of forming integrated circuit packages having an LED molded into the package, and the integrated circuit package formed thereby. In embodiments, an integrated circuit package according to the present invention may be fabricated by assembling a plurality of integrated circuits on a panel, which may be for example a PCB substrate, leadframe or TAB tape. The integrated circuit may include one or more semiconductor die, passive components and the LED. Once assembled on the panel, the one or more semiconductor die, passive components and LED are all encapsulated in a molding compound, and the integrated circuits are then singularized to form individual integrated circuit packages.

In embodiments of the invention, the integrated circuits are cut from the panel so that the one or more die and passive components are entirely contained and enclosed within each singularized package. However, a lens of the LED is positioned within the molding compound such that a portion of the lens is severed during the singularization process. The result is that the end of the lens remaining within the singularized package is flush with an outer edge of the package, and capable of emitting light outside of the integrated circuit package. In embodiments, the integrated circuit package may then be mounted within an outer lid to form any of a variety of integrated circuit devices including an SD flash memory and a dual SD/USB flash memory. The embedded LED may be used in other integrated circuit devices.

The integrated circuit package including an embedded LED may be used in a variety of ways. For example, the embedded LED may be used to confirm proper installation of the integrated circuit package into a host electronic device. Alternatively or additionally, the LED may be used to indicate a read/write operation from/to the integrated circuit device. The embedded LED may be used to provide other visual indications of a state of the integrated circuit package.

DETAILED DESCRIPTION

Embodiments of the invention will now be described with reference to FIGS. 1 through 14 which relate to relate to methods of forming integrated circuit packages having an LED molded into the package, and the integrated circuit package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 2:
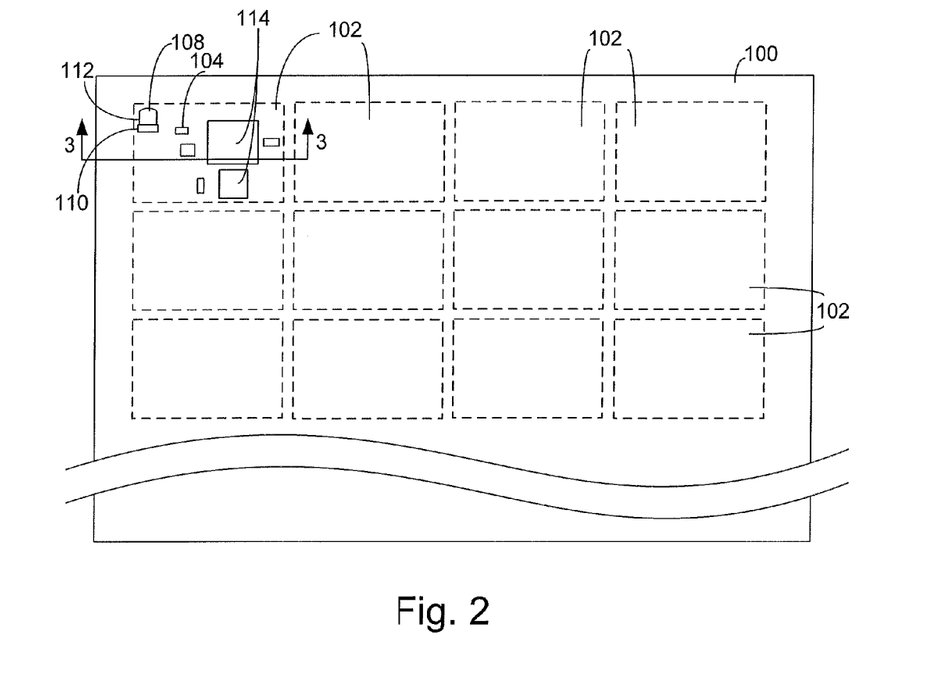
FIG. 2 is a top view of a panel of integrated circuits including die, components and LEDs during the fabrication process according to the present invention.
Figure 3:
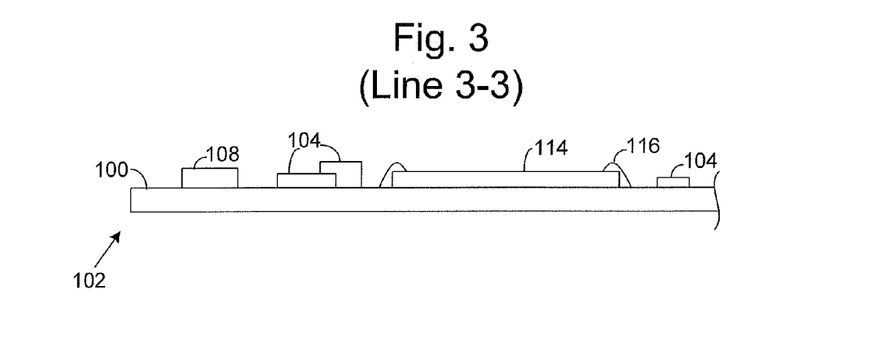
FIG. 3 is a cross-sectional view through line 3-3 in FIG. 2.

A method for forming an integrated circuit package having an LED molded into the package will now be described with reference to the flow chart of FIG. 1 and the different views of the integrated circuit package at various stages in its fabrication in FIGS. 2 through 7. The fabrication process begins in step 50 with a panel 100 (FIGS. 2 and 3). The type of panel 100 used in the present invention is not critical and may for example be a substrate in the form of a printed circuit board ("PCB"), a lead frame, a tab automated bonding ("TAB") tape or other known base on which integrated circuits may be assembled and encapsulated. In an embodiment, panel 100 may be a PCB substrate formed of a dielectric core having a conductive layer formed on the top and/or bottom surface of the core. In step 52, a conductance pattern may be formed on one or both conductive layers of panel 100 to establish an electrical connection between the components mounted on panel 100. The conductance pattern may further include contact pads, lead fingers or other external connectors for electrical connection between the integrated circuit components and external electronic devices.

A plurality of discreet integrated circuits 102 may be batch processed on panel 100 to achieve economies of scale. Each of these integrated circuits may then be encapsulated and singulated to form a plurality of integrated circuit packages as explained hereinafter. Each integrated circuit 102 being formed on panel 100 may include one or more passive components 104 surface mounted to panel 100 in step 54. The type and number of passive components 104 is not critical to the present invention and may vary widely in alternative embodiments. In an embodiment, the passive components 104 may include capacitors and/or resisters physically and electrically coupled to panel 100 as is known in the art.

Each integrated circuit 102 may further include a light emitting diode ("LED") 108 surface mounted to panel 100 in a step 56. Each LED 108 includes a diode 110 for emitting light upon receipt of an electrical current, and a lens 112 for focusing the emitted light. The LED 108 in the finished integrated circuit package is in communication with a controller in the package. As explained in greater detail hereinafter, LED 108 may be included to provide a visual indicator of a state of the integrated circuit package when in use. A diode and lens, which may be modified and used according to the principals of the present invention, may be provided, for example, by SunLED Co. of Kowloon, Hong Kong. In embodiments of the present invention, lens 112 may be formed of plastic and may be elongated in comparison to lenses used in conventional LEDs. It is understood that lens 112 may be formed of materials other than plastic, and may be of conventional length in alternative embodiments of the present invention.

Each integrated circuit 102 may further include one or more semiconductor die mounted to panel 100 in step 58 in a known adhesive or eutectic die bond process, using a known die-attach compound. The number and type of semiconductor die 114 may vary greatly in alternative embodiments of the invention. In one embodiment, the one or more die may include a flash memory array (e.g., NOR, NAND or other), S-RAM or DDT, and/or a controller chip such as an ASIC. Other semiconductor die are contemplated. Where a plurality of die are provided, they may be arranged in a system-in-a-package (SiP) or a multi-chip module (MCM) configuration. Other arrangements are contemplated. The one or more die 114 may be electrically connected to panel 100 by wire bonds 116 in step 60 in a known wire-bond process.

Figure 1:
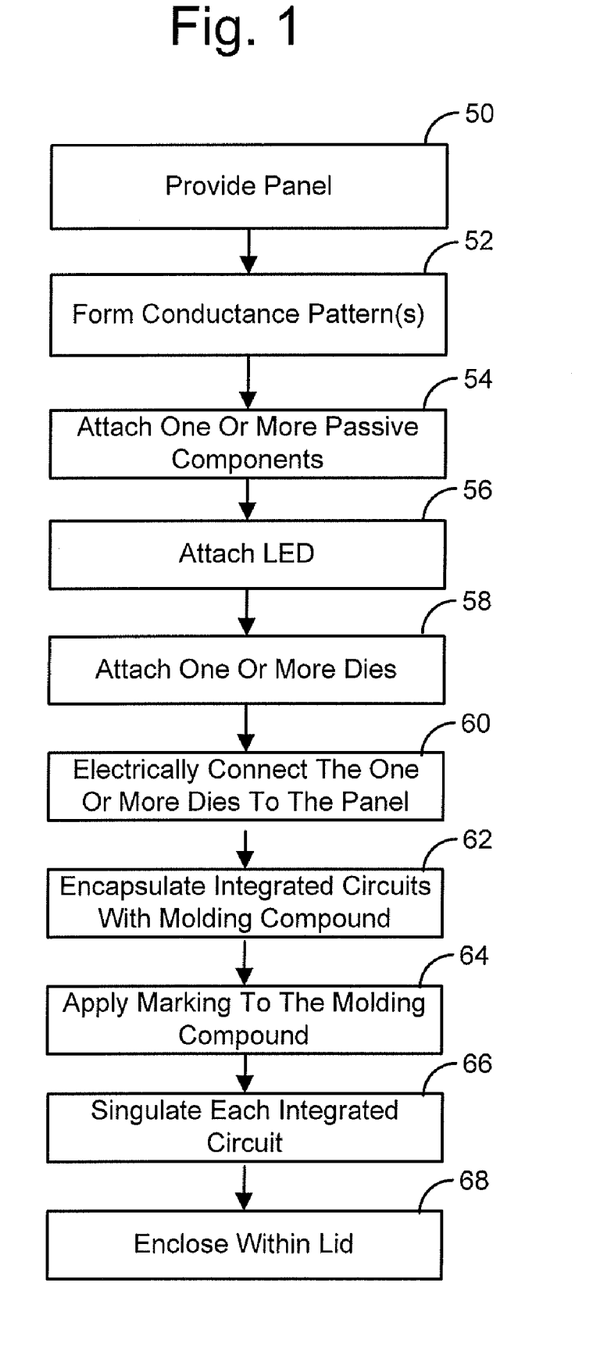
FIG. 1 is a flowchart of the method of fabricating an integrated circuit package having an LED molded into the package.

While the mounting of the passive components, the LED and the semiconductor die are disclosed as separate steps in the flowchart FIG. 1, it is understood that these steps may be performed in different orders, and altogether in alternative embodiments. Although not specifically shown on the flowchart of FIG. 1, various visual and automated inspections may be made during the above-described fabrication of the plurality of integrated circuits on panel 100.

Figure 4:
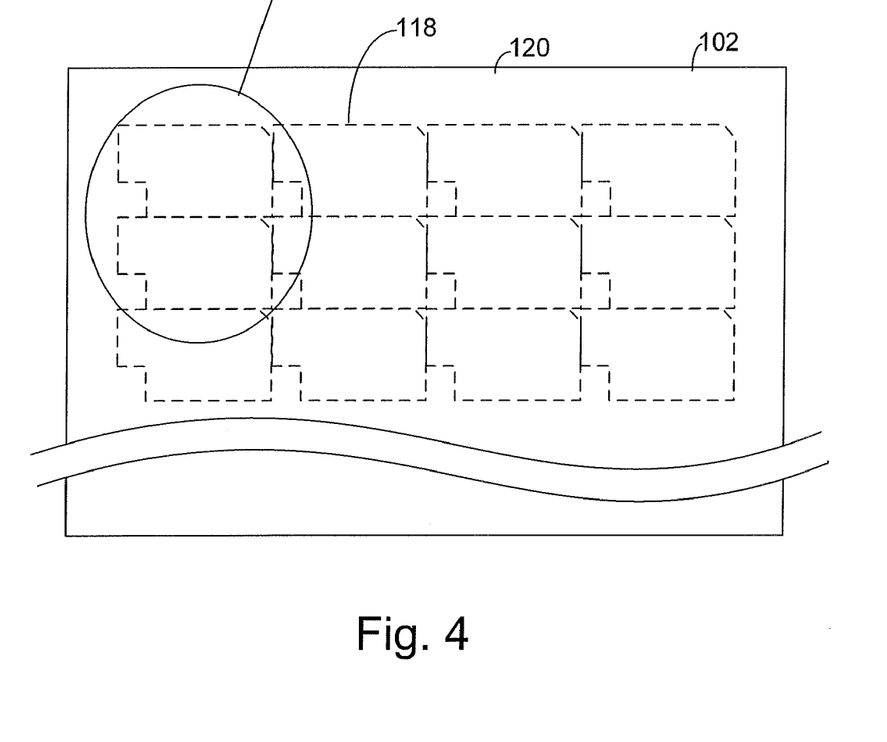
FIG. 4 is a top view of a panel of molded integrated circuits according to the present invention prior to being cut into individual integrated circuit packages.

Once the plurality of integrated circuits 102 have been formed on panel 100, each of the integrated circuits 102 may be encapsulated with a molding compound 120 in step 62 and as shown in FIGS. 3 and 4. Molding compound 120 may be an epoxy such as for example, Novalac, available for example, from Siliconware Precision Industries Co., Ltd., of Taichung, Taiwan. The molding compound may be applied according to various processes, including by transfer molding or flood molding techniques to form a unitary encapsulation on panel 100 encompassing all of the integrated circuits 102. In accordance with the present invention, LED 108 may be encapsulated within the molding compound along with the one or more die 114 and passive components 104.

After molding step 62, a marking can be applied to the molding compound 120 in step 64. The marking may for example be a logo or other information printed on the surface of the molding compound for each integrated circuit. The marking may for example indicate manufacturer and/or type of device. Marking step 64 may be omitted in alternative embodiments of the present invention.

Each of the integrated circuits 102 may then be singulated in step 66. Singulation step 66 involves cutting integrated circuits 102 on panel 100 into a plurality of individual integrated circuit packages. As used herein, the term cutting is used to refer to cutting, sawing, punching or other methods used to separate the integrated circuits 102 into individual integrated circuit packages. Known cutting devices include, for example, water jet cutting, laser cutting, water guided laser cutting, dry media cutting, and diamond coated wire. Water jet cutting may be the preferred cutting device given its small cutting width (e.g., 50 microns), its ability to shape small features, and its rapid cutting rate. Water can also be used together with laser cutting to help complement or focus its effects. As is known in the art, the above cutting methods are able to achieve sophisticated rectilinear and/or curvilinear shapes of the individualized integrated circuit packages. A further description of the cutting of integrated circuits from a panel and the shapes which may be achieved thereby is disclosed in published U.S. Application No. 2004/0259291, entitled, "Method For Efficiently Producing Removable Peripheral Cards," which application is assigned to the owner of the present invention and which application is incorporated by reference herein in its entirety. It is understood that the singulated integrated circuits may be formed by other processes than that described above in alternative embodiments.

The shape into which each of the integrated circuits may be cut from panel 100 may vary in alternative embodiments. However, an outline of the cutting shape in one embodiment is shown in dashed lines 118 on the top view of the encapsulated panel in FIG. 4. As can be seen from the enlarged view of FIG. 5, the integrated circuits 102 are cut from panel 100 so that the one or more die 114 and passive components 106 are entirely contained and enclosed within each singularized package. However, lens 112 of LED 108 is positioned within molding compound 124, such that the lens is cut during the singularization process, leaving a tip of the lens separated from the singularized package. The result is that the end of lens 112 remaining within the singularized package is flush with an outer edge of the package.

Figure 6:
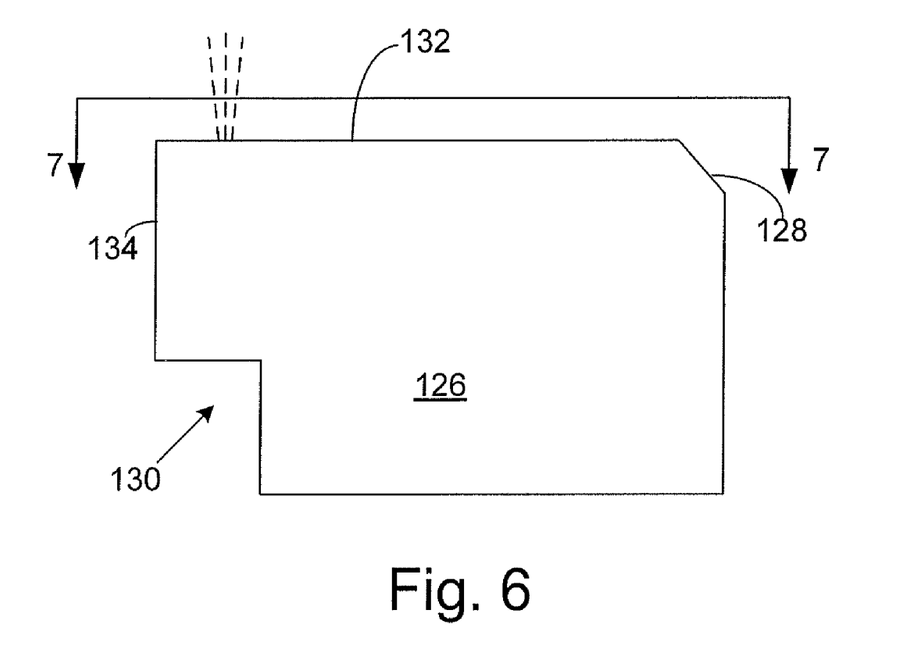
FIG. 6 is a top view of an integrated circuit package according to the present invention.
Figure 7:
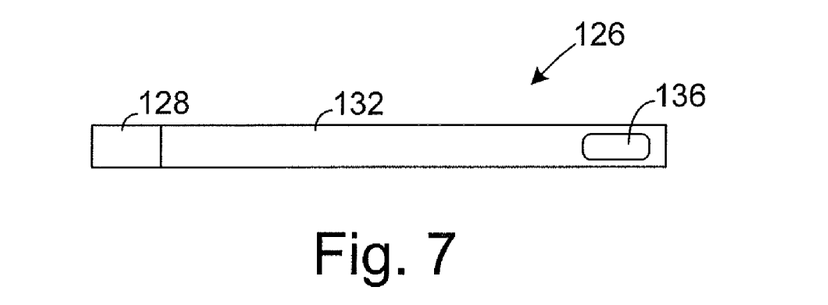
FIG. 7 is an edge view though line 7-7 in FIG. 6.

An example of an integrated circuit ("IC") package 126 which may be obtained by the above-described process is shown in FIGS. 6 and 7. FIG. 6 is a top view of an IC package 126 cut from panel 100 and including integrated circuit 102 encapsulated within molding compound 124 as described above. IC package 126 may include a chamfer 128 in a first corner and a notch 130 in a corner diametrically opposed from chamfer 128. IC package 126 may further include a first edge 132 adjacent to chamfer 128, which first edge joins with a second edge 134 adjacent notch 130. FIG. 7 is a view along line 7-7 in FIG. 6 of first edge 132 and chamfer 128. As seen in FIGS. 6 and 7, an end 136 of diode lens 112 lies flush with edge 132 and exposed to the environment surrounding within IC package 126. Thus, upon activation of LED 108, light from diode 110 is focused by lens 112 and emitted from lens end 136 in edge 132 of package 126 (as indicated by dashed lines in FIG. 6) where it may be seen from outside the package. The LED 108 may be positioned within IC package 126 so that the lens is oriented differently, and end 136 is flush with an edge of IC package 126, other than first edge 132.

Figure 5:
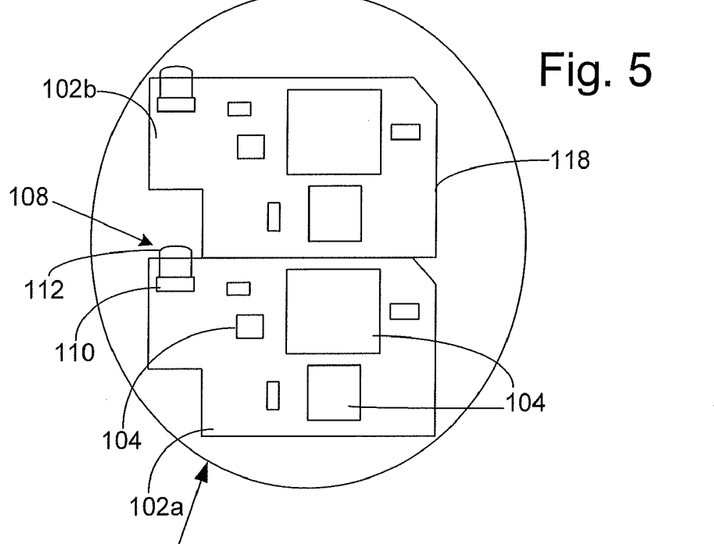
FIG. 5 is an enlarged view of a pair of integrated circuits with the internal components and cut lines shown.

Referring to FIGS. 5 and 6, in an embodiment, the cut tip of lens 112 in an integrated circuit 102a resides within notch 130 of next adjacent integrated circuit 102b. As notch 130 in the finished integrated circuit 102b is cut away, the cut tip does not interfere with or form part of the package formed by finished integrated circuit 102b. It is understood that the integrated circuits on panel 100 may be cut into a variety of other shapes in alternative embodiments, with a tip of the embedded LED flush with an edge of the package. In such embodiments, the tip of the LED may be provided in a straight or rounded portion of the edge. It is also understood the cut tip from a first integrated circuit may remain embedded in an unused portion of a second, adjacent integrated circuit when the integrated circuits are singulated.

Figure 8:
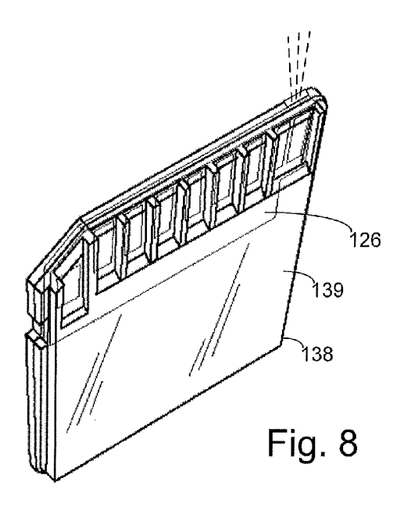
FIGS. 8 and 9 are perspective and top views of a flash memory card including the integrated circuit package of FIG. 6 mounted in a top and bottom lid.
Figure 9:
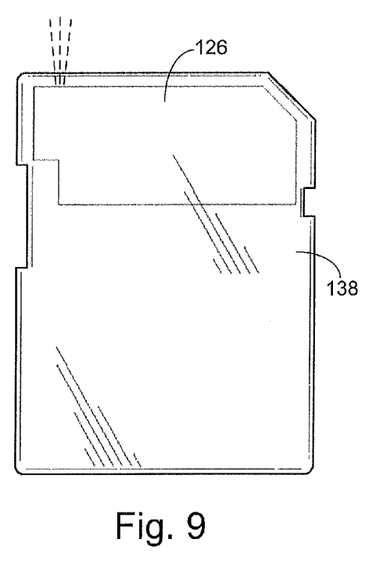
Figure 10:
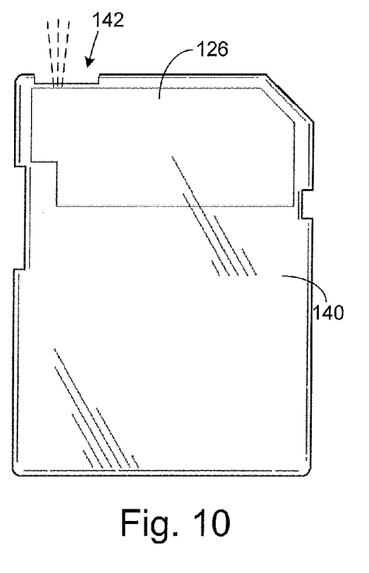
FIG. 10 is a top view of a flash memory card according to an alternative embodiment including the integrated circuit package of FIG. 6 mounted in a top and bottom lid.

Referring again to the flowchart of FIG. 1 and the views of FIGS. 8-10, a completed IC package 126 may further be enclosed within an external package or lid (or pair of lids) 138 in step 68. Such a lid would provide an external covering for the IC package and establish external product features. In one embodiment, the IC package 126 and lid 138 may comprise a Flash Memory Card 139, such as those manufactured by SanDisk Corporation of Sunnyvale, Calif. However, it is understood that IC package, including embedded LED 108, may be used in a wide variety of other flash memory and integrated circuit devices. Such devices may include a Compact Flash, a Smart Media, an SD Card, a Mini SD Card, an MMC, an xD Card, Transflash or Memory Stick. Other devices are contemplated.

In order that light from LED 108 may be visible through lid 138, some or all of lid 138 may be transparent or semi transparent as shown in FIGS. 8 and 9. Alternatively, as shown in the embodiment of FIG. 10, integrated circuit package 126 may be housed within a lid 140 having an opening 142 through which light from LED 108 may shine. It is understood that in further embodiments of the present invention, lid 138/140 may be omitted, and integrated circuit package 126 be used without any additional external covering. In the embodiments of FIGS. 8-10, the LED is located adjacent contact pins on the underside of card 139, and the LED may be obscured from view in some uses of card 139. As indicated above, the LED may be provided in a different edge of IC package 126 so that it may be visible even if an end of card 139 including the contact pins is covered.

Figure 11:
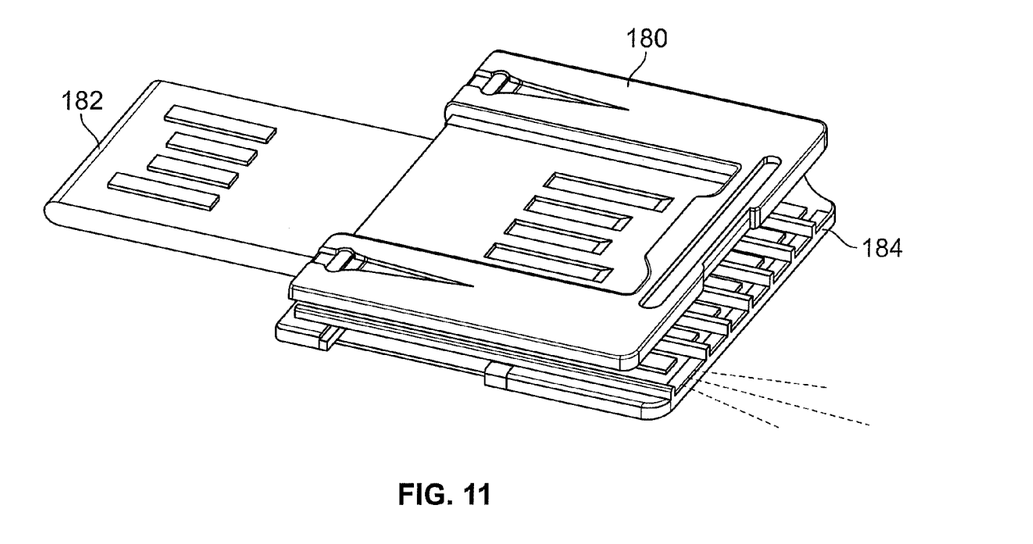
FIG. 11 is a perspective view duel flash memory card including an integrated circuit according to the present invention.

As a further device example, FIG. 11 shows a perspective view of an IC package including an embedded LED used in a dual interface card 180 capable of use with both SD and USB interfaces. In particular, a first end 182 is adapted for use with a USB interface, and a second end 184 is adapted for use with an SD interface. Such a dual interface card is shown and described in U.S. Utility patent application Ser. No. 10/826, 801 filed on Apr. 16, 2004, U.S. Utility patent application Ser. No. 10/826,796 filed on Apr. 16, 2004, and related U.S. Design patent application Serial No. 29/203,693 filed on Apr. 16, 2004, U.S. Design patent application Serial No. 29/203, 694 filed on Apr. 16, 2004, U.S. Design patent application Serial No. 29/226,505 filed on Mar. 28, 2005, and U.S. Design patent application Serial No. 29/226,477 filed on Mar. 28, 2005. Each of these applications is incorporated by reference herein in its entirety.

The card 180 shown in FIG. 11 may include an IC package 126 having an embedded LED as described above for emitting light (as indicated by the dashed lines in FIG. 11) when the card 180 is used in the USB port.

IC package 126 including embedded LED 108 may be used in a variety of ways. For example, referring to the flow chart of FIG. 12, embedded LED 108 may be used to confirm proper installation of the IC package 126 into a host electronic device. In particular, IC package 126 may be inserted into a host device in step 200. In step 202, a controller within the IC package detects whether proper electrical connection with the host device is detected. If proper electrical connection is detected, the LED is illuminated in step 204. If proper electrical connection is not detected, the LED is not lit (step 206).

Figure 12:
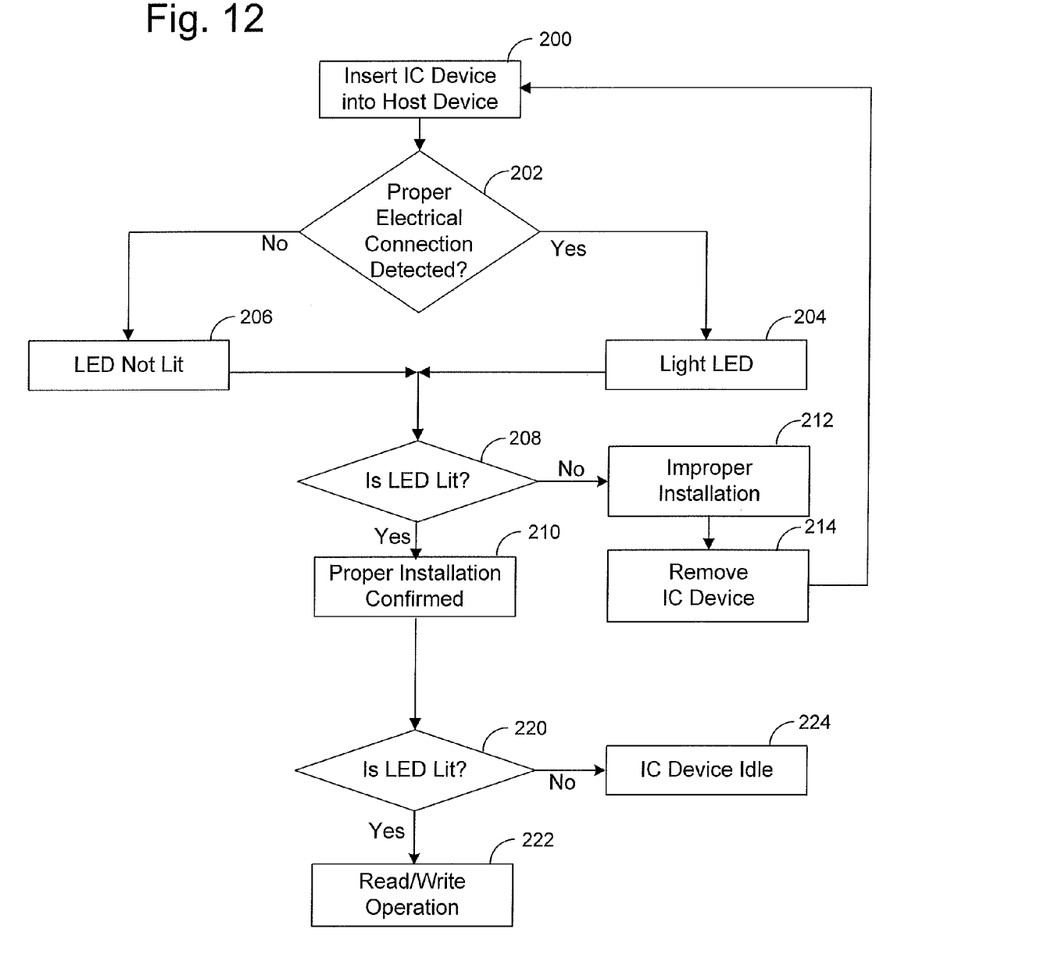
FIG. 12 is a flowchart of a method of using the embedded LED to confirm proper installation of the integrated circuit package and/or read/write operations according to the present invention.
Figure 13:
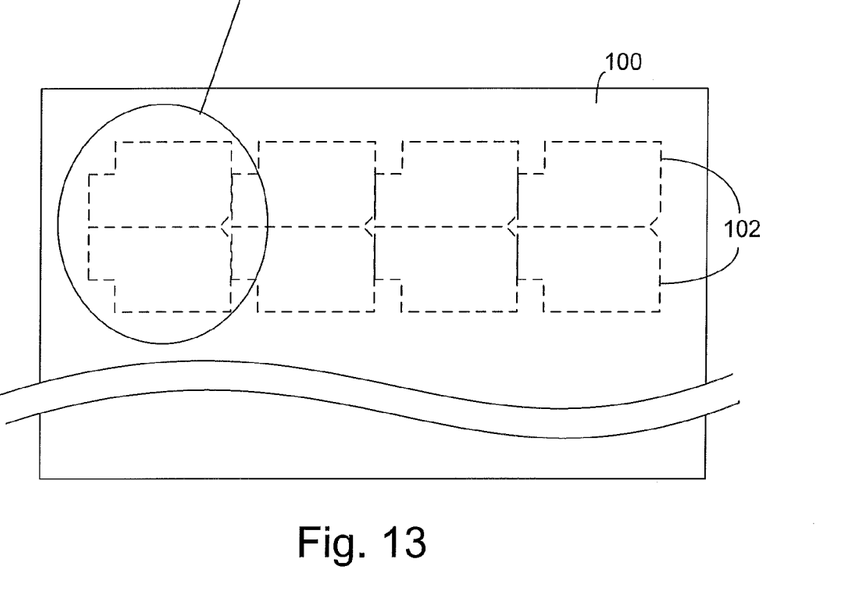
FIG. 13 is a top view of a panel of molded integrated circuit packages according to an alternative embodiment of the present invention prior to being cut into individual integrated circuit packages.
Figure 14:
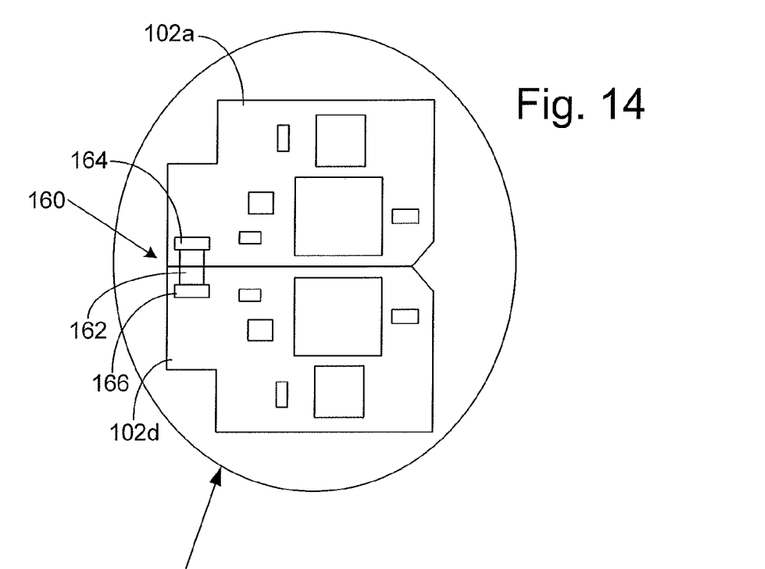
FIG. 14 is an enlarged view of a pair of integrated circuits of FIG. 13 with the internal components and cut lines shown.

In step 208, the user of IC package 126 then checks to see whether the LED is illuminated. If it is, proper installation of IC package 126 is confirmed (step 210). On the other hand, if the LED is not lit, this indicates an improper installation of the IC package (step 212). The IC package may then be removed in step 214 and reinserted.

After installation, a lit LED may be used to indicate a read/write operation from/to the integrated circuit device (steps 220-222). In embodiments, the LED may light up to indicate proper installation, and the LED may flash on and off to show read/write operations. The reverse, as well as other lighting schemes, are contemplated It is understood that embodiments of the invention may include the installation confirmation steps 200 through 214 without performing the read/write indicator steps 220 through 222. It is also understood that embodiments of the present invention may include read/write indication steps 220 through 222, but omit installation confirmation steps 200 through 214. It is further contemplated that both installation confirmation steps 200 through 214 and read/write operation steps 220 through 222 may be omitted, and LED perform some other visual indicator of a state of IC package 126.

In embodiments of the present invention, LED 108 emits a signal within the visible light spectrum. However, in an alternative embodiment, LED 108 may emit a light in the infrared or ultraviolet light spectrum. Moreover, while a single LED has been shown encapsulated within package 126, it is understood that two or more LEDs may be encapsulated within package 126, each having an end flush with an edge of the package to emit light outside of the package. In such embodiments, the two or more LEDs may extend to the same or different edges. The two or more LEDs may emit the same or different colors.

In embodiments of the above-described fabrication process, each integrated circuit 102 on panel 100 is positioned in substantially the same orientation as each other integrated circuit 102 on panel 100. In such an embodiment, a tip of LED lens 112 remains in panel 100 after singulation, or otherwise goes unused. In an alternative embodiment of the invention shown in FIGS. 13 and 14, adjacent rows of integrated circuits 102 may be configured as mirror images of each other (or at least be cut in mirror image shapes to each other). Such an embodiment may use a shared LED 160 between adjacent, mirror-imaged integrated circuits 102c and 102d. Shared LED 160 includes a lens 162, a diode 164 adjacent a first end of lens 162 and positioned within the first integrated circuit 102c, and a second diode 166 at a second end of lens 162 and positioned within the second, mirror-imaged, integrated circuit 102d. According to such an embodiment, when the integrated circuits are singulated into individual packages, lens 162 is cut as described above. Upon singulation, diode 164 and a portion of lens 162 reside within the first IC package and diode 166 and the remaining portion of lens 162 reside within the second IC package. It is contemplated that two adjacent integrated circuits 102 may be mirrored with respect to each other at edges other than that shown in FIGS. 13 and 14 so that lens 162 would lie flush with edges other than that shown in FIGS. 13 and 14 upon singulation of the integrated circuits.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A flash memory device, comprising:
a base;
one or more semiconductor die mounted on the base;
a light emitting diode mounted on the base;
molding compound encapsulating the one or more semiconductor die and the light emitting diode, an end of the light emitting diode lying flush with an edge of the integrated circuit package and capable of emitting light outside the package; and
one or more lids in which the encapsulated one or more semiconductor die and the light emitting diode may be enclosed.

2. A flash memory device as recited in claim 1, wherein the base comprises one of a substrate, a leadframe and a tape.

3. A flash memory device as recited in claim 1, the flash memory device comprising a dual SD/USB flash memory having an SD connector and a USB connector.

4. A flash memory device as recited in claim 3, the LED capable of indicating a state of the flash memory device when USB connector is engaged with a USB port of a host device.

5. A flash memory device as recited in claim 1, the flash memory device comprising an SD flash memory.

6. A flash memory device as recited in claim 1, the flash memory device comprising one of a compact flash, a smart media, an SD card, a mini SD card, an MMC, an xD card, transflash or memory stick.

7. A flash memory device as recited in claim 1, the one or more semiconductor die comprising a flash memory module.

8. A flash memory device as recited in claim 1, the one or more semiconductor die comprising a flash memory module and a controller.

* * * * *